United States Patent
Lin et al.

(10) Patent No.: US 8,072,362 B2
(45) Date of Patent: Dec. 6, 2011

(54) MODULATOR WITH LOOP-DELAY COMPENSATION

(75) Inventors: Tsung-Hsien Lin, Taipei (TW); Yu-Yu Chen, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/632,789

(22) Filed: Dec. 7, 2009

(65) Prior Publication Data
US 2011/0133968 A1    Jun. 9, 2011

(51) Int. Cl.
*H03M 3/00* (2006.01)
(52) U.S. Cl. ......... 341/143; 341/118; 341/120; 341/155
(58) Field of Classification Search .......... 341/118–121, 341/143, 155
See application file for complete search history.

(56) References Cited

U.S. PATENT DOCUMENTS

| | | | | |
|---|---|---|---|---|
| 5,870,048 | A * | 2/1999 | Kuo et al. | 341/143 |
| 6,300,890 | B1 * | 10/2001 | Okuda et al. | 341/143 |
| 6,985,098 | B2 * | 1/2006 | Lee | 341/120 |
| 7,405,682 | B2 * | 7/2008 | Ebner et al. | 341/120 |
| 7,423,567 | B2 * | 9/2008 | Melanson | 341/143 |
| 7,453,382 | B2 * | 11/2008 | Wiesbauer et al. | 341/143 |
| 7,583,765 | B2 * | 9/2009 | Beamish | 375/346 |
| 7,696,913 | B2 * | 4/2010 | Melanson | 341/143 |
| 7,852,249 | B2 * | 12/2010 | Oliaei | 341/143 |
| 2007/0188362 | A1 * | 8/2007 | Doerrer et al. | 341/143 |
| 2007/0210948 | A1 | 9/2007 | Wang | |
| 2008/0062026 | A1 * | 3/2008 | Melanson | 341/155 |
| 2008/0136693 | A1 * | 6/2008 | Kim et al. | 341/143 |
| 2008/0165043 | A1 * | 7/2008 | Wiesbauer et al. | 341/143 |
| 2008/0272946 | A1 * | 11/2008 | Melanson | 341/143 |
| 2011/0032132 | A1 * | 2/2011 | Lin et al. | 341/143 |

OTHER PUBLICATIONS

S. Yan and E. Sanchez-Sinencio, "A Continuous-Time Sigma-Delta Modulator with 88-dB Dynamic Range and 1.1-MHz Signal Bandwidth," ISSCC Dig. Tech. Papers, pp. 62-63, Feb. 2003.
P. Fontaine, A. N. Mohieldin and A. Bellaouar, "A Low-Noise Low-Voltage CT ΔΣ Modulator with Digital Compensation of Excess Loop Delay," ISSCC Dig. Tech. Papers, pp. 498-499, Feb. 2005.
G. Mitteregger et al., "A 14b 20mW 640 MHz CMOS CT ΔΣ ADC with 20MHz Signal Bandwidth and 12b ENOB," ISSCC Dig. Tech. Papers, pp. 131-140, Feb. 2006.
Y. Chen, "Compensation filter for the excess-loop delay of a delta-sigma modulator," Sep. 2009.

* cited by examiner

*Primary Examiner* — Linh Nguyen
(74) *Attorney, Agent, or Firm* — Stout, Uxa, Buyan & Mullins, LLP

(57) ABSTRACT

A modulator is constructed with a loop-delay compensation. A delta-sigma modulator generates a quantization code, and a digital compensation filter receives the quantization code and outputs a digital code. The digital compensation filter then feeds the digital code back to the delta-sigma modulator.

13 Claims, 8 Drawing Sheets

US 8,072,362 B2

MODULATOR WITH LOOP-DELAY COMPENSATION

BACKGROUND OF THE INVENTION

1. Field of the Invention

The present invention generally relates to a delta-sigma modulator, and more particularly to a delta-sigma modulator with a digitally-assisted compensation filter.

2. Description of Related Art

A delta-sigma ($\Delta\Sigma$) modulator or sigma-delta ($\Sigma\Delta$) modulator is a feedback system that produces high-resolution signals through simple circuit blocks. The delta-sigma modulator is widely adapted to electronic circuits such as analog-to-digital converters (ADCs), digital-to-analog converters (DACs) or frequency synthesizers, and is highly attractive in wireless communications due to its simplicity and low-power consumption.

FIG. 1A shows a mathematical model of an ideal continuous-time (3rd order) delta-sigma modulator, indicating $A_1$, $A_2$ and $A_3$ feedback DAC coefficients, fs sampling frequency, X(s) input signal, E(z) quantization noise, and Y(z) output code. However, loop delay exists in the feedback path for a real circuit environment. The loop delay causes the shift of the pole of the modulator system, and thus alters the original noise-transfer-function (NTF) of the modulator. In order to resolve this issue, an analog compensation path $k_f$ is added as shown in FIG. 1B, where $T_d$ is the loop delay, and $k_1$, $k_2$, and $k_3$ are feedback DAC coefficients with consideration for the loop delay.

Nevertheless, the addition of the analog compensation path $k_f$ disadvantageously increases additional power consumption, and also increases distortion from the additional analog circuit.

As a consequence of the conventional analog compensation path not being able to effectively solve the excess-loop delay issue, a need has arisen to propose a novel scheme that is capable of resolving the excess-loop delay issue by the replacement of analog circuitry with a precise digital circuit.

SUMMARY OF THE INVENTION

In view of the foregoing, it is an object of the embodiment of the present invention to provide a compensation filter for overcoming excess-loop delay in a delta-sigma modulator without additional analog circuitry.

According to one embodiment, a modulator with loop-delay compensation is provided primarily to include a continuous-time delta-sigma modulator and a digitally-assisted compensation filter. The delta-sigma modulator includes an integration circuit and an analog-to-digital converter (ADC) coupled to receive output from the integration circuit and then generating a quantization code. The compensation filter receives the quantization code and then outputs a digital code, which is fed to a digital-to-analog converter (DAC) that feeds its output to the integration circuit.

DETAILED DESCRIPTION OF THE INVENTION

Figure 2A:
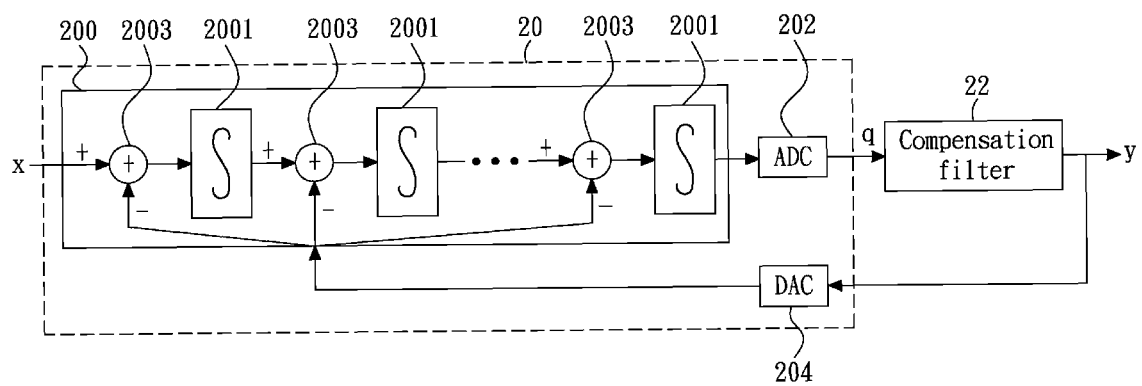
FIG. 2A shows a block diagram of a continuous-time delta-sigma modulator with a compensation filter (e.g., a digital compensation filter) according to one embodiment of the present invention.
Figure 2B:
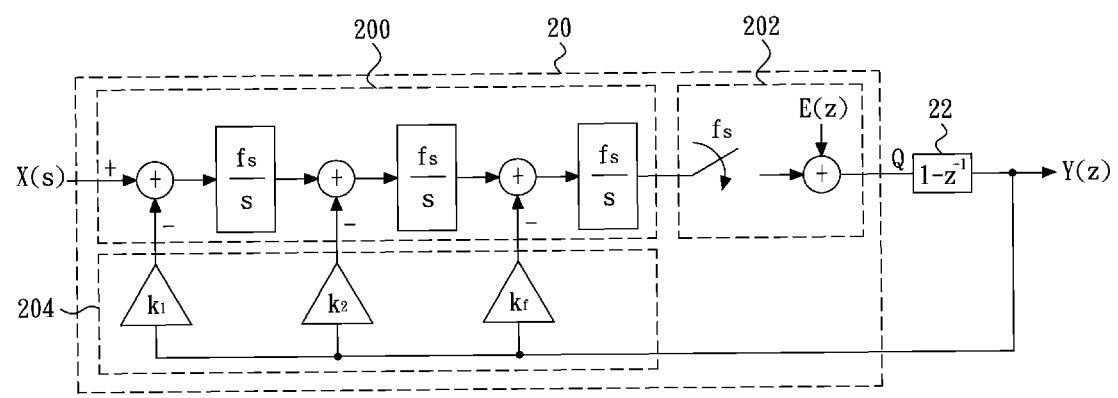
FIG. 2B shows an equivalent mathematical model of the block diagram of FIG. 2A.

FIG. 2A shows a block diagram of a continuous-time (CT) delta-sigma ($\Delta\Sigma$) modulator 20 with a compensation filter 22 according to one embodiment of the present invention. FIG. 2B shows an equivalent mathematical model or frequency-domain model of the FIG. 2A block diagram. Some analysis of the mathematical model is discussed in a disclosure entitled "Compensation filter for the excess-loop delay of a delta-sigma modulator," by Yu-Yu Chen, one of the inventors of the present application, the disclosure of which is hereby incorporated by reference.

In the illustrated embodiment, the delta-sigma (or sigma-delta, $\Sigma\Delta$) modulator 20 includes an integration circuit 200 and an analog-to-digital converter (ADC) or quantizer 202 in the feedforward path, and a digital-to-analog converter (DAC) 204 in the feedback path. Specifically, the integration circuit 200 is made of a number of series-connected integrators 2001. In general, an n-th order delta-sigma modulator 20 has n integrators 2001. Every set of two neighboring integrators 2001 is inserted with an adder 2003, while the first integrator 2001 is preceded by an adder 2003. The adder 2003 adds the output of a preceding integrator 2001 (or adds an (analog) input signal x if the adder 2003 is the first one), subtracts the output of the DAC 204, and then outputs the difference to a succeeding integrator 2001. The ADC 202 receives the output of the integration circuit 200, and then outputs its resultant quantization code q to the compensation filter 22. The DAC 204 receives the (digital) output code y out of the compensation filter 22, and then outputs its resultant analog output to the integration circuit 200.

Figure 3A:
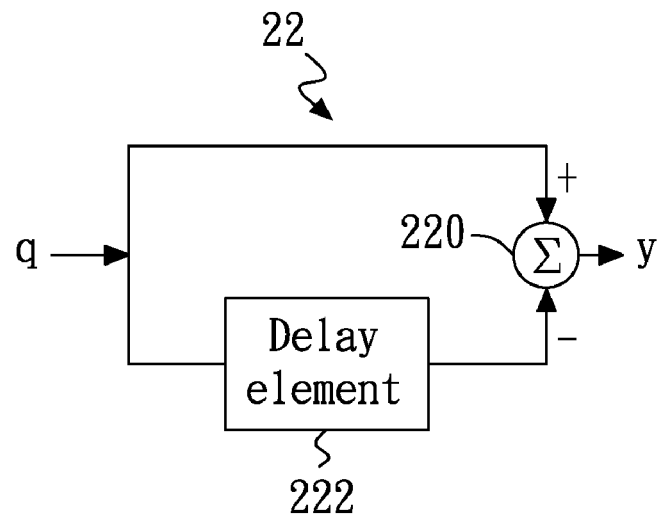
FIG. 3A shows a detailed block diagram of the compensation filter of FIG. 2A according to the embodiment of the present invention.
Figure 3B:
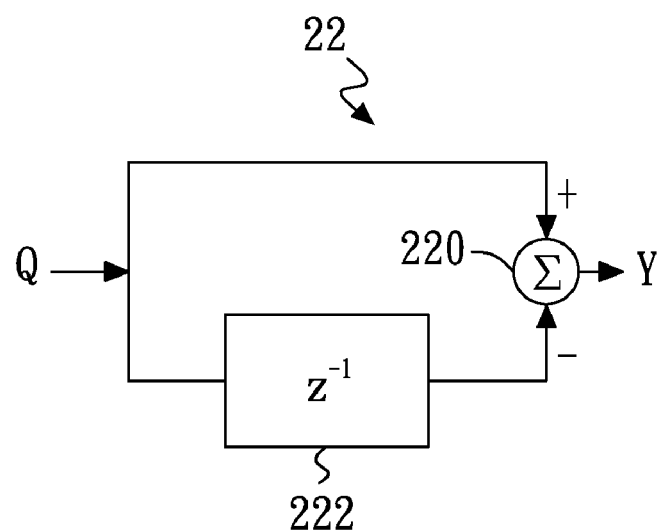
FIG. 3B shows an equivalent mathematical model of the block diagram of FIG. 3A.

FIG. 3A shows a detailed block diagram of the compensation filter 22 of FIG. 2A according to the embodiment of the present invention. FIG. 3B shows an equivalent mathematical model or frequency-domain model of the block diagram of FIG. 3A. Specifically, the compensation filter 22 is a digitally-assisted loop filter (e.g., a digital compensation filter), which generates the difference between two consecutive quantization codes q[n−1] and q[n] from the ADC 202. That is, y[n]=q[n]−q[n−1]. In the embodiment, the compensation filter 22 includes an adder 220 that subtracts a delayed quantization code q[n−1] (generated by a delay element 222) from a present quantization code q[n]. In z-domain, the transfer function of the compensation filter 22 may be expressed as $1-z^{-1}$ (as shown in FIG. 2B). The function $1-z^{-1}$ in the compensation filter 22 is used to compensate the pole that is caused due to the loop delay in the real feedback path of the delta-sigma modulator 20.

The equivalent transfer function in s-domain may be rewritten as $1-z^{-1} \sim s/f_s$ where $f_s$ is a sampling frequency and $s/f_s$ (e.g., $s/f_s$ approximating, being about equal to, or being about equal to $1-z^{-1}$), functions as a differentiator.

Figure 1A:
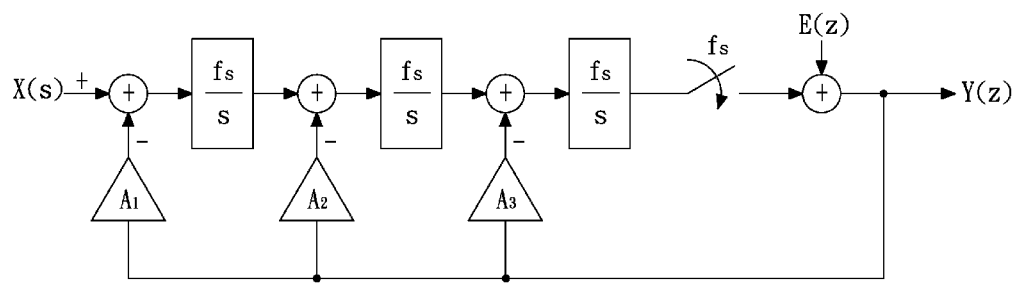
FIG. 1A shows the mathematical model of an ideal continuous-time delta-sigma modulator according to the prior art.
Figure 1B:
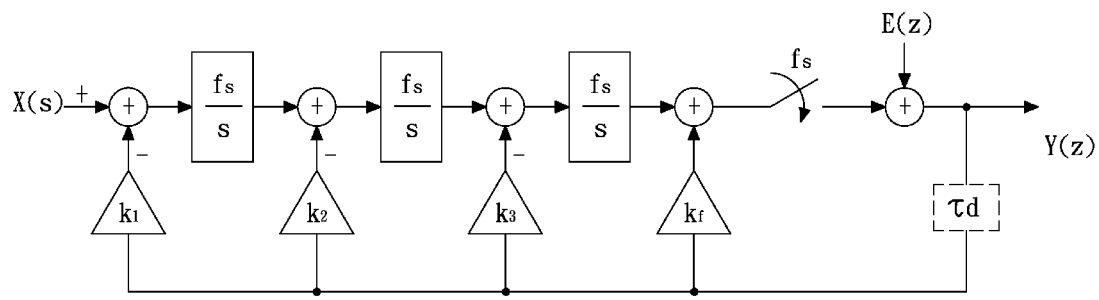
FIG. 1B shows the mathematical model of a real continuous-time delta-sigma modulator with an analog compensation path according to the prior art.
Figure 4:
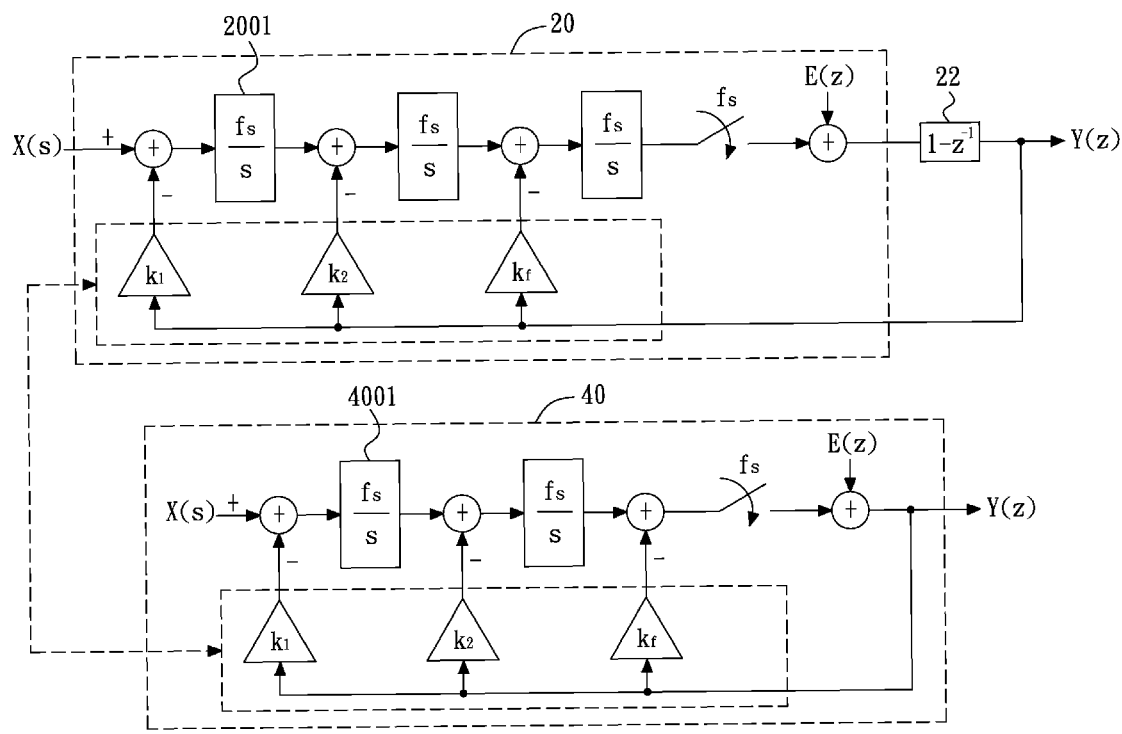
FIG. 4 shows an exemplary 3rd order delta-sigma modulator with the compensation filter according to the present embodiment, and a conventional 2nd order delta-sigma modulator with analog compensation feedback.

In the embodiment, the coefficients (such as $k_1, k_2 \ldots k_f$ in FIG. 2B) of the DAC 204 may be obtained directly from the conventional analog compensation technique as illustrated in FIG. 1B. FIG. 4 shows an exemplary 3rd order (i.e., with three integrators 2001) delta-sigma modulator 20 with the compensation filter 22 according to the present embodiment, and also shows a conventional 2nd order (i.e., with two integrators 4001) delta-sigma modulator 40 with analog compensation feedback. The conventional 2nd order delta-sigma modulator 40 has the DAC coefficients $k_1$ and $k_2$ for the two integrators 4001 respectively, and a compensation coefficient $k_f$. These coefficients $k_1$, $k_2$ and $k_f$ are used (as indicated by the dashed arrows) as the DAC coefficients $k_1$, $k_2$ and $k_f$ for the three integrators 2001 respectively for the delta-sigma modulator 20 of the present embodiment. In general, the DAC coefficients of an N-th order delta-sigma modulator according to the present embodiment may be directly obtained from the DAC coefficients of a conventional (N−1)-th order delta-sigma modulator with analog compensation feedback.

The design of the analog feedback DAC coefficients for the conventional delta-sigma modulator is discussed, for example, in the following disclosures, which are hereby incorporated by reference: S. Yan and E. Sanchez-Sinencio, "A Continuous-Time Sigma-Delta Modulator with 88-dB Dynamic Range and 1.1-MHz Signal Bandwidth," *ISSCC Dig. Tech. Papers*, pp. 62-63, February 2003; P. Fontaine, A. N. Mohieldin and A. Bellaouar, "A Low-Noise Low-Voltage CT ΔΣ Modulator with Digital Compensation of Excess Loop Delay," *ISSCC Dig. Tech. Papers*, pp. 498-499, February 2005; and G. Mitteregger et al., "A 14b 20 mW 640 MHz CMOS CT ΔΣ ADC with 20 MHz Signal Bandwidth and 12b ENOB," *ISSCC Dig. Tech. Papers*, pp. 131-140, February 2006.

Figure 5:
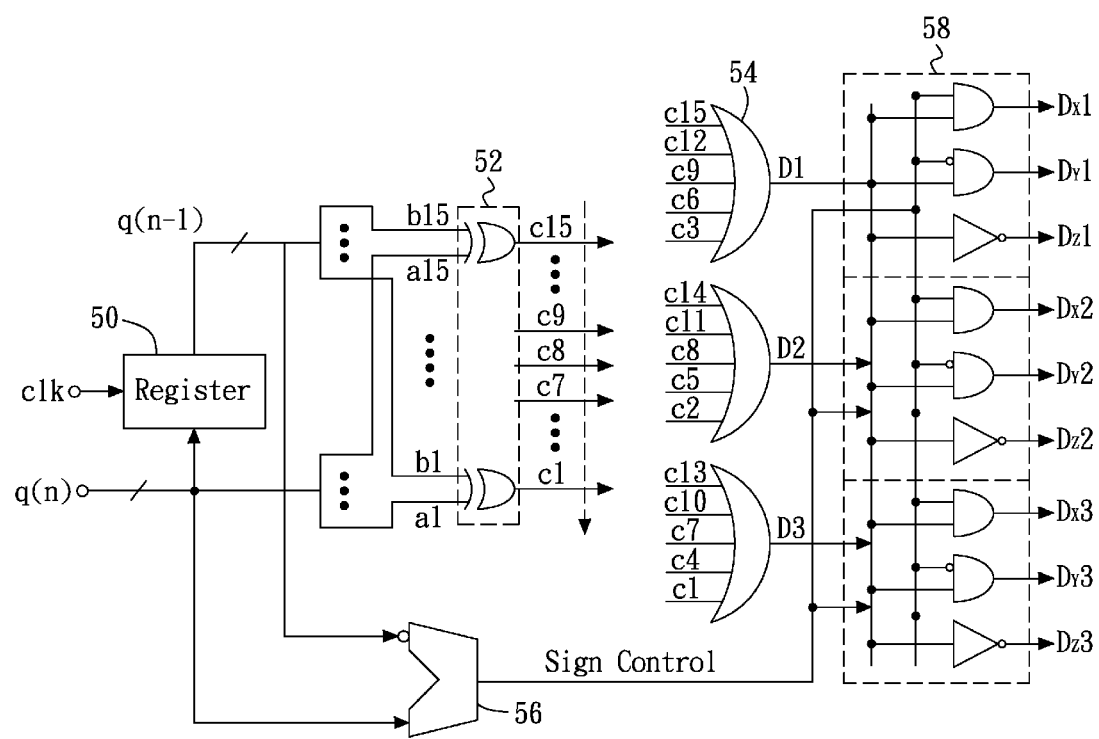
FIG. 5 exemplifies a circuit implementation of the compensation filter of FIG. 2A or FIG. 3A.

FIG. 5 exemplifies circuit implementation of the compensation filter 22 of FIG. 2A or 3A. In the embodiment, quantization code q is a thermometer code. The present quantization code q[n] from a 4-bit ADC 202 and the previous quantization code q[n−1] from a register 50 are fed into an exclusive-OR (XOR) gate array 52, thereby resulting in the absolute value of $(1-z^{-1})$, i.e., $|1-z^{-1}|$, which has a consecutive "1" pattern. The actual value of $|1-z^{-1}|$ is the number of "1" occurrences in the consecutive "1" pattern. For example, the actual value of a pattern (00001 10000 0000) is two. If the resolution of the ADC 202 is 2N, the required resolution of $|1-z^{-1}|$ is thus $2^{N-2}$.

It is noted that, in the embodiment, the consecutive "1" (e.g., consecutive "1" pattern) appears in random position (e.g., randomly). For example, the subtraction of $|1-z^{-1}|$ on 7-5 and 3-1 (the present value minus the previous value) is both 2, but the consecutive "1" of the outputs of the XOR gate array 52 is located differently in $(C_7, C_6)$ and $(C_3, C_2)$ respectively. The logic high of DAC input is $(D_1, D_3)$ and $(D_1, D_2)$, respectively. This randomization may be advantageously utilized to reduce the harmonic tones on DAC mismatch.

According to one aspect of the present embodiment, the most (e.g., greatest) number of "1" occurrences of the XOR gate array outputs $c_1$ to $c_{15}$ is only three, and therefore the XOR gate array outputs $c_1$ to $c_{15}$ are coupled to the input nodes of the three 5-input OR gates 54 in a particular way such that the outputs with adjacent sequence numbers are not coupled to the same OR gate 54.

Figure 6A:
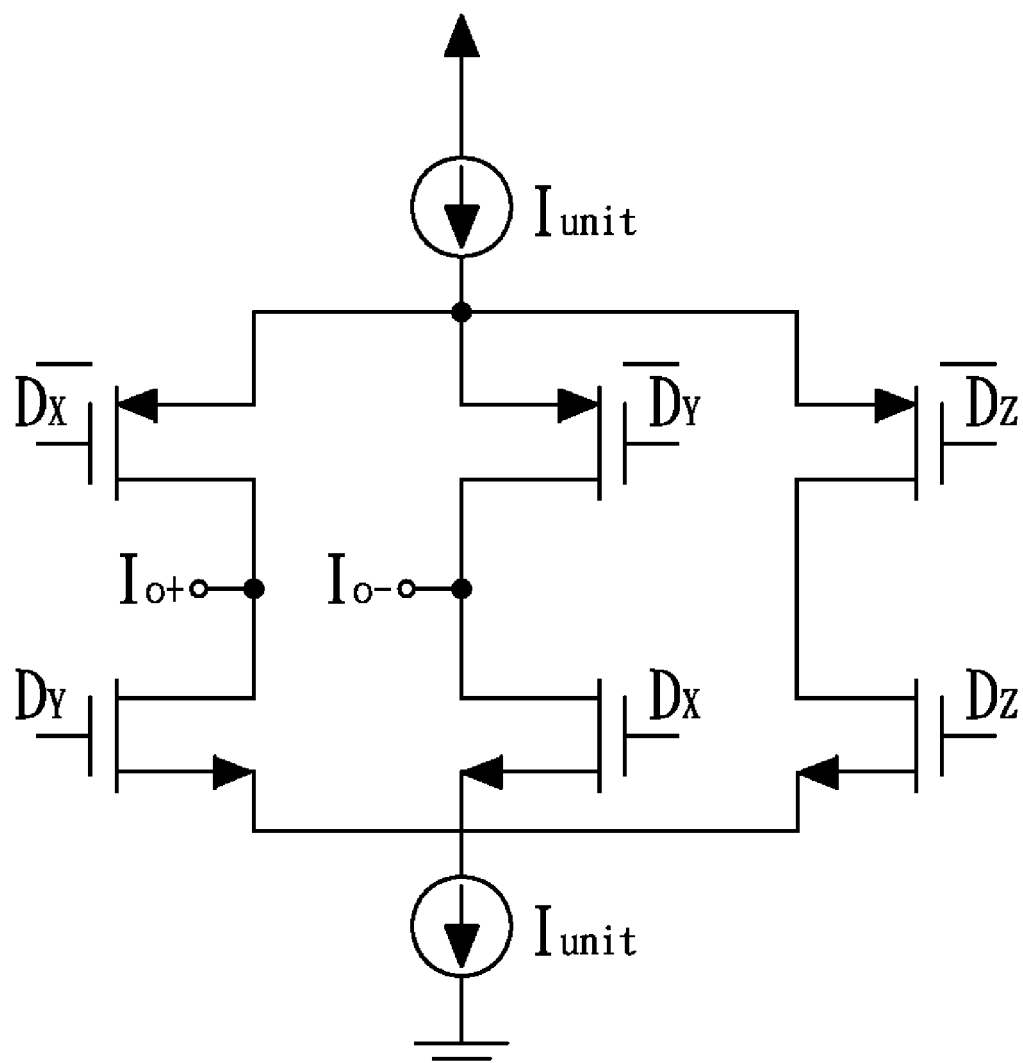
FIG. 6A schematically shows a tri-state DAC unit according to the embodiment of the present invention.
Figure 6B:
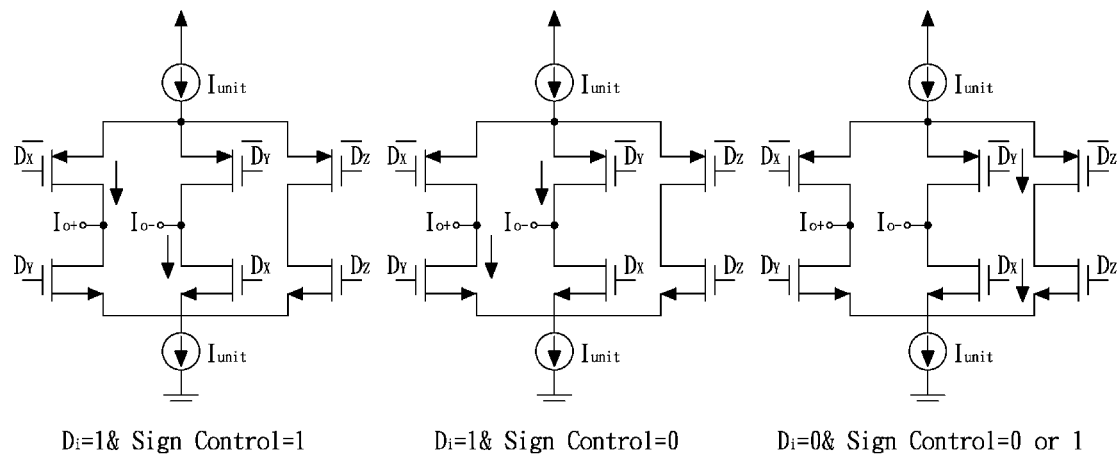
FIG. 6B shows various circuit operations of the tri-state DAC unit of FIG. 6A.

Moreover, a subtractor 56 is used to generate a sign control signal. The sign control signal and the outputs $D_1$, $D_2$ and $D_3$ of the OR gates 54 are processed by logic circuits 58 in order to obtain control signals $D_X$, $D_Y$ and $D_Z$ for the switches of the DAC 204. FIG. 6A schematically shows a tri-state DAC unit according to the embodiment of the present invention, and FIG. 6B shows various circuit operations of the tri-state DAC unit, where $D_i$ is the output of the OR gate 54, and $D_X$, $D_Y$ and $D_Z$ are the outputs of the logic circuit 58. Specifically, when $D_i$ is high, the corresponding DAC unit is selected and $D_Z$ will be low. Then, either $D_X$ or $D_Y$ will be high, depending on the sign control signal. On the other hand, when $D_i$ is low, the corresponding DAC unit will be idle without any output current, and $D_Z$ will be high to maintain the current flow of current source.

Although specific embodiments have been illustrated and described, it will be appreciated by those skilled in the art that various modifications may be made without departing from the scope of the present invention, which is intended to be limited solely by the appended claims.

What is claimed is:

1. A modulator with loop-delay compensation, comprising:
   a delta-sigma modulator configured to generate a quantization code that is a thermometer code; and
   a digital compensation filter coupled to receive the quantization code and output a digital code, the digital compensation filter being coupled and configured then to feed the digital code back to the delta-sigma modulator, the digital compensation filter generating the digital code as a difference between consecutive quantization codes;
   wherein the digital compensation filter comprises:
   a register configured to generate a delayed quantization code from the present quantization code;
   an exclusive-OR (XOR) gate array coupled to receive the present quantization code and the delayed quantization code, thereby resulting in an absolute value of $1-z^{-1}$ that is a transfer function expressed in z-domain of the digital compensation filter, which has consecutive "1" pattern, wherein an actual value of the absolute of $1-z^{-1}$ is a number of "1" occurrences in the consecutive "1" pattern; and
   a plurality of OR gates coupled to receive outputs of the XOR gate array.

2. The modulator of claim 1, wherein the delta-sigma modulator is a continuous-time (CT) delta-sigma modulator.

3. The modulator of claim 1, wherein the digital compensation filter comprises:
   a delay element configured to generate a delayed quantization code q[n−1] from the present quantization code q[n]; and
   an adder configured to generate the output digital code y[n] by subtracting the delayed quantization code q[n−1] from the present quantization code q[n], which is expressed as y[n]=q[n]−q[n−1].

4. The modulator of claim 1, wherein a transfer function of the digital compensation filter in s-domain is expressed as about $s/f_s$ where $f_s$ is a sampling frequency.

5. The modulator of claim 1, wherein the digital compensation filter comprises a differentiator.

6. The modulator of claim 1, further comprising:
   a subtractor configured to generate a sign control signal according to the present quantization code and the delayed quantization code; and logic circuits coupled to receive outputs of the OR gates and the sign control signal, thereby generating control signals for control digital-to-analog (DAC) units of the delta-sigma modulator.

7. The modulator of claim 1, wherein the delta-sigma modulator comprises:
   an integration circuit;
   an analog-to-digital converter (ADC) coupled to receive output of the integration circuit, and then to generate and provide the quantization code to the digital compensation filter; and
   a digital-to-analog converter (DAC) coupled to receive the digital code and then feed an output to the integration circuit.

8. The modulator of claim 7, wherein the integration circuit comprises:
   a plurality of series-connected integrators; and
   a plurality of adders, wherein every two neighboring integrators are inserted with one of the adders, with each of the integrators being preceded by one of the adders;
   wherein the adder adds output of the preceding integrator or adds an input signal if the adder is the first one, the adder further subtracting output from the DAC, and the adder then outputting the difference to the succeeding integrator.

9. A modulator with loop-delay compensation, comprising:
   an integration circuit;
   an analog-to-digital converter (ADC) coupled to receive output of the integration circuit, and then to generate a quantization code;
   a digital compensation filter coupled to receive the quantization code and output a digital code, the digital compensation filter generating the digital code as a difference between the consecutive quantization codes; and
   a digital-to-analog converter (DAC) coupled to receive the digital code and then to feed an output to the integration circuit;
   wherein the digital compensation filter comprises:
   a register configured to generate a delayed quantization code from the present quantization code, wherein the quantization code is a thermometer code;
   an exclusive-OR (XOR) gate array coupled to receive the present quantization code and the delayed quantization code, thereby resulting in an absolute value of $1-z^{-1}$ that is a transfer function expressed in z-domain of the digital compensation filter, which has a consecutive "1" pattern, wherein an actual value of the absolute of $1-z^{-1}$ is a number of "1" occurrences in the consecutive "1" pattern; and
   a plurality of OR gates coupled to receive outputs of the XOR gate array.

10. The modulator of claim 9, wherein the digital compensation filter comprises:
    a delay element configured to generate a delayed quantization code $q[n-1]$ from the present quantization code $q[n]$; and
    an adder configured to generate the output digital code $y[n]$ by subtracting the delayed quantization code $q[n-1]$ from the present quantization code $q[n]$, which is expressed as $y[n]=q[n]q[n-1]$.

11. The modulator of claim 9, wherein the digital compensation filter comprises a differentiator.

12. The modulator of claim 9, further comprising:
    a subtractor configured to generate a sign control signal according to the present quantization code and the delayed quantization code; and
    logic circuits coupled to receive outputs of the OR gates and the sign control signal, thereby generating control signals for control digital-to-analog (DAC) units of the delta-sigma modulator.

13. The modulator of claim 9, wherein the integration circuit comprises;
    a plurality of series-connected integrators; and
    a plurality of adders, wherein every two neighboring integrators is inserted with one of the adders, while each of the integrators is preceded by one of the adders;
    wherein the adder adds output of the preceding integrator or adds an input signal if the adder is the first one, the adder further subtracts output out of the DAC, and the adder then outputs the difference to the succeeding integrator.

* * * * *